(12) United States Patent
Yu et al.

(10) Patent No.: US 8,141,964 B1
(45) Date of Patent: Mar. 27, 2012

(54) CHASSIS OF ELECTRONIC DEVICE

(75) Inventors: Mo-Ming Yu, Shenzhen (CN); Lei Zheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/967,065

(22) Filed: Dec. 14, 2010

(30) Foreign Application Priority Data

Nov. 26, 2010 (CN) .......................... 2010 1 0561019

(51) Int. Cl.
*A47B 81/00* (2006.01)
*A47G 29/00* (2006.01)
(52) U.S. Cl. .................... 312/223.2; 312/265.5
(58) Field of Classification Search ............. 312/223.1, 312/223.2, 265.5, 265.6, 257.1, 292, 301; 361/679.02, 679.01, 724, 727
See application file for complete search history.

(56) References Cited

U.S. PATENT DOCUMENTS

| 4,500,146 | A  | * | 2/1985  | Peterson ..................... | 312/257.1 |
| 6,793,299 | B2 | * | 9/2004  | Newberry et al. ............ | 312/199   |
| 7,359,204 | B1 | * | 4/2008  | Jang et al. ..................... | 361/715   |
| 7,374,259 | B2 | * | 5/2008  | Wu et al. ..................... | 312/223.2 |
| 2005/0168116 | A1 | * | 8/2005  | Chuang ........................ | 312/265.5 |
| 2005/0281004 | A1 | * | 12/2005 | Li ................................. | 361/724   |
| 2008/0191590 | A1 | * | 8/2008  | Lin et al. ..................... | 312/223.2 |
| 2010/0007252 | A1 | * | 1/2010  | Liu ............................... | 312/223.2 |
| 2010/0026148 | A1 | * | 2/2010  | Zhang et al. ............... | 312/223.2 |
| 2010/0265645 | A1 | * | 10/2010 | Wang et al. ................ | 361/679.4 |

* cited by examiner

*Primary Examiner* — David Dunn
*Assistant Examiner* — Ryan A Doyle
(74) *Attorney, Agent, or Firm* — Altis Law Group, Inc.

(57) ABSTRACT

A chassis of an electronic device includes a base and a side plate covering the base. The side plate includes a first plate and a second plate slidably connected to the first plate. When the side plate is disengaged from the base, one of the first and second plates is capable of sliding in a first direction away from the other one of the first and second plates, and the first and second plates are capable of easily sliding along the base in a second direction perpendicular to the first direction.

12 Claims, 4 Drawing Sheets

CHASSIS OF ELECTRONIC DEVICE

BACKGROUND

1. Technical Field

The present disclosure relates to a chassis of an electronic device.

2. Description of Related Art

Generally, in a chassis of an electronic device, such as a server, a top cover of the chassis is often bulky, heavy, and because of contact with other parts of the chassis, there is a lot of friction to overcome making it difficult to slide the cover to an open or closed position.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
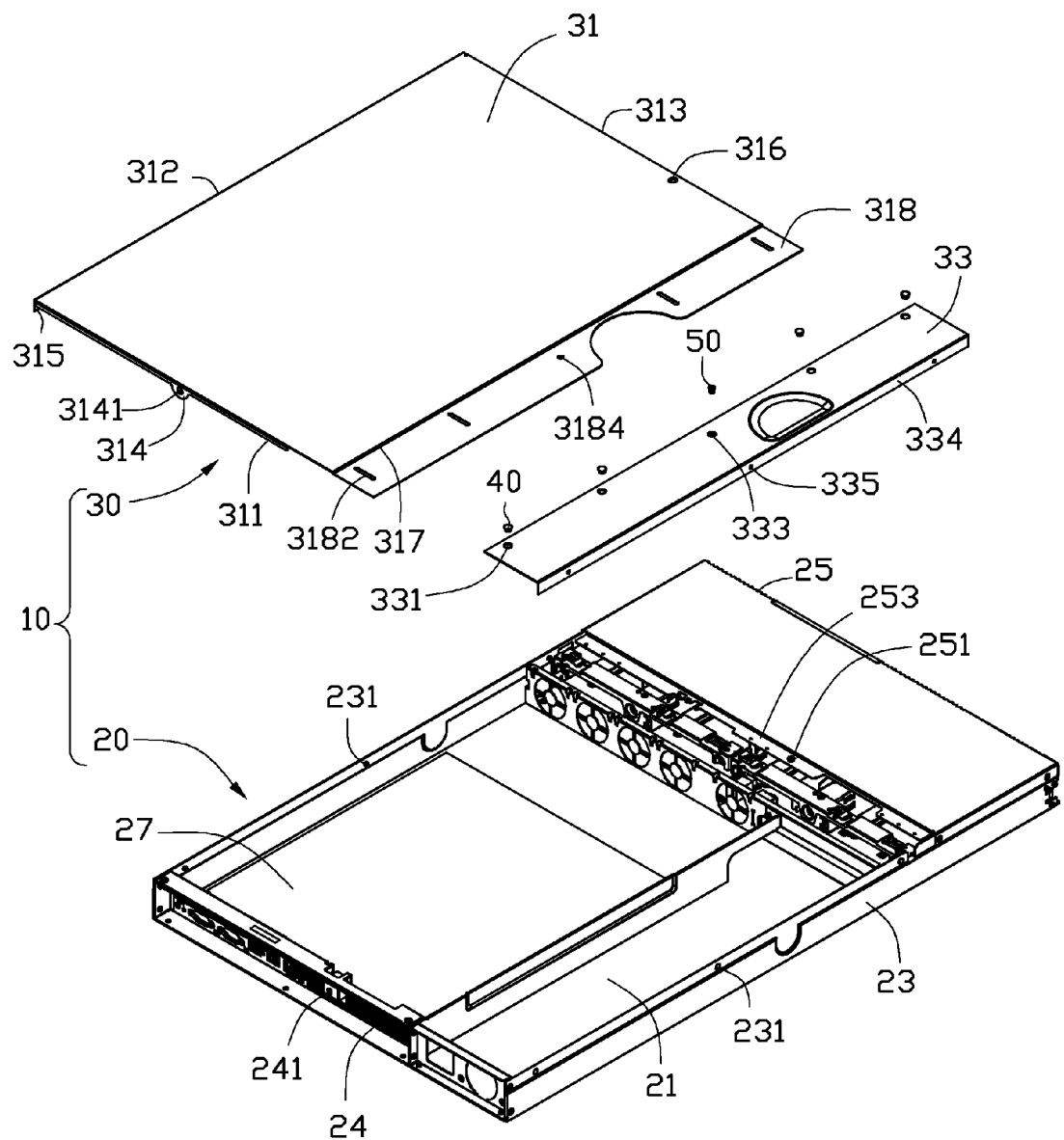
FIG. 1 is an exploded, isometric view of an embodiment of a chassis of an electronic device.

Referring to FIG. 1, an embodiment of a chassis 10 of an electronic device includes a base 20, and a side plate 30.

A plurality of electronic components 27, such as a motherboard, is installed in the base 20. The base 20 includes a rectangular bottom wall 21, two sidewalls 23 perpendicularly extending from opposite sides of the bottom wall 21, and a first end wall 24 and a second end wall 25 perpendicularly extending from opposite ends of the bottom wall 21. A fixing portion 231 is formed on an upper section of each sidewall 23. Two fixing portions 241 and 251 are respectively formed on upper sections of the first and second end walls 24 and 25. In this embodiment, the fixing portion 231 is a plurality of threaded holes, the fixing portion 241 is a threaded hole, and the fixing portion 251 is a threaded hole defined in a stop plate 253 perpendicularly extending from a top of the second end wall 25.

The side plate 30 includes a rectangular first plate 31, and a rectangular second plate 33. Three securing portions are respectively formed on three connected edges 311, 312, and 313 of the first plate 31, corresponding to the fixing portions 241, 231, and 251 of the base 20, respectively. In this embodiment, the securing portion of the edge 311 is a through hole 3141 defined in a tab 314 perpendicularly extending down from the edge 311. The securing portion of the edge 312 is a plurality of through holes (not shown) defined in a flange 315 perpendicularly extending down from the edge 312. The securing portion of the edge 313 is a through hole 316 defined in the first plate 31 adjacent to the edge 313. A thin connection piece 318 extends from an edge 317 of the first plate 31 opposite to the edge 312. A plurality of slide slots 3182 perpendicular to the edge 317 is defined in the connection piece 318. A first fixing hole 3184 is defined in a middle of the connection piece 318. A plurality of through holes 331 and a second fixing hole 333 are defined in the second plate 33 adjacent to a first edge of the second plate 33. A securing portion 335 is formed on a second edge of the second plate 33 opposite to the first edge, corresponding to the fixing portion 231 of the base 20. In this embodiment, the securing portion 335 is a plurality of through holes defined in a flange 334 perpendicularly extending down from the second edge of the second plate 33.

Figure 2:
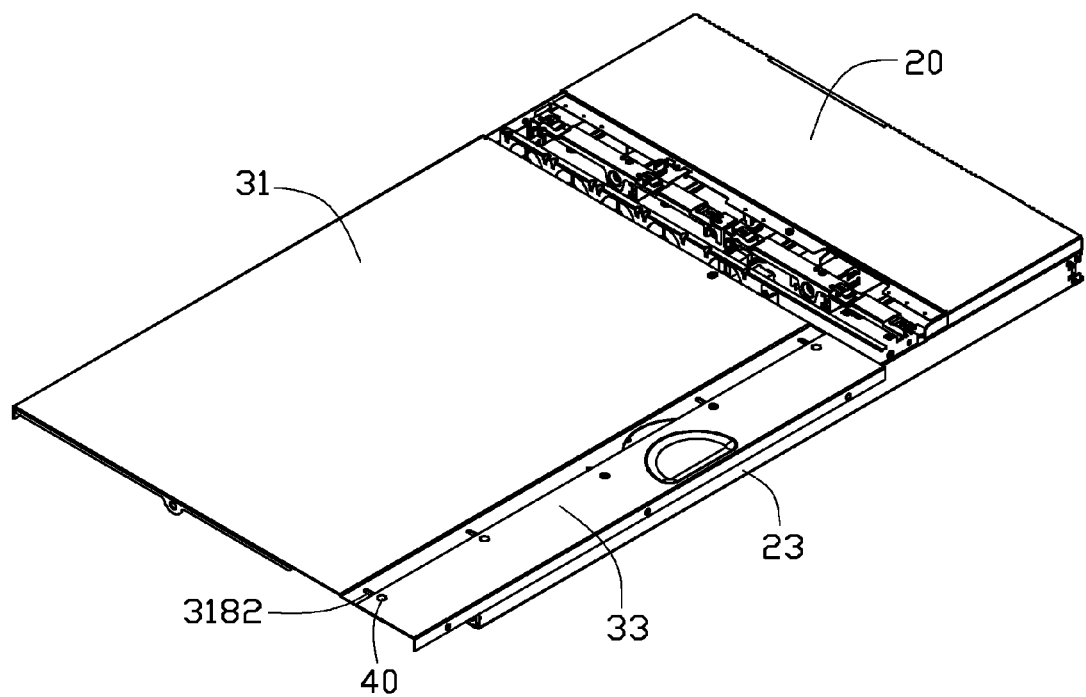
FIGS. 2 and 3 are assembling process views of FIG. 1.
Figure 3:
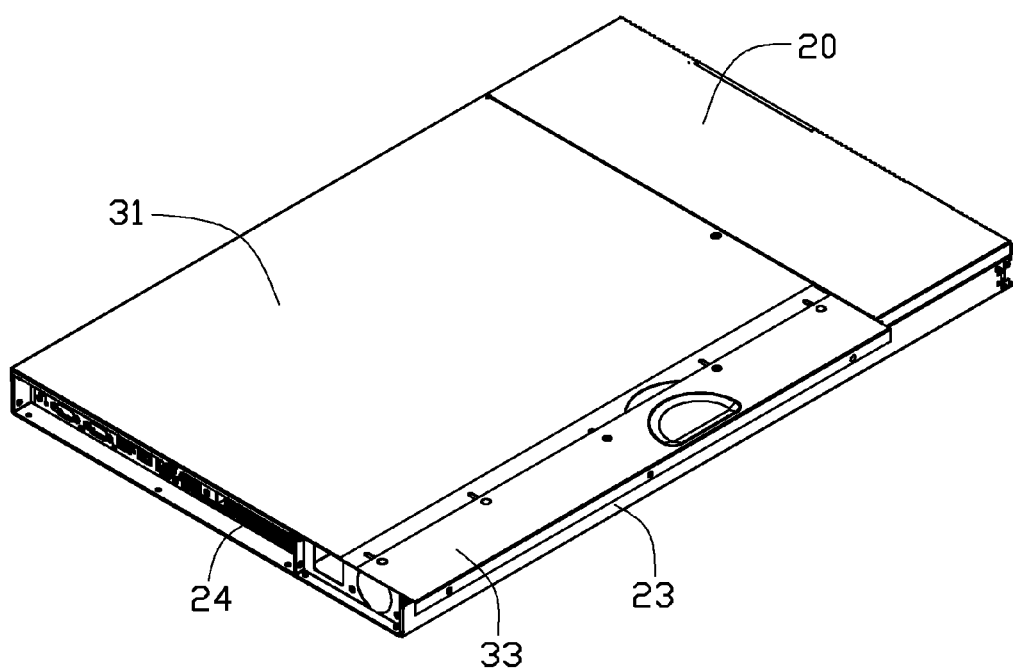
Figure 4:
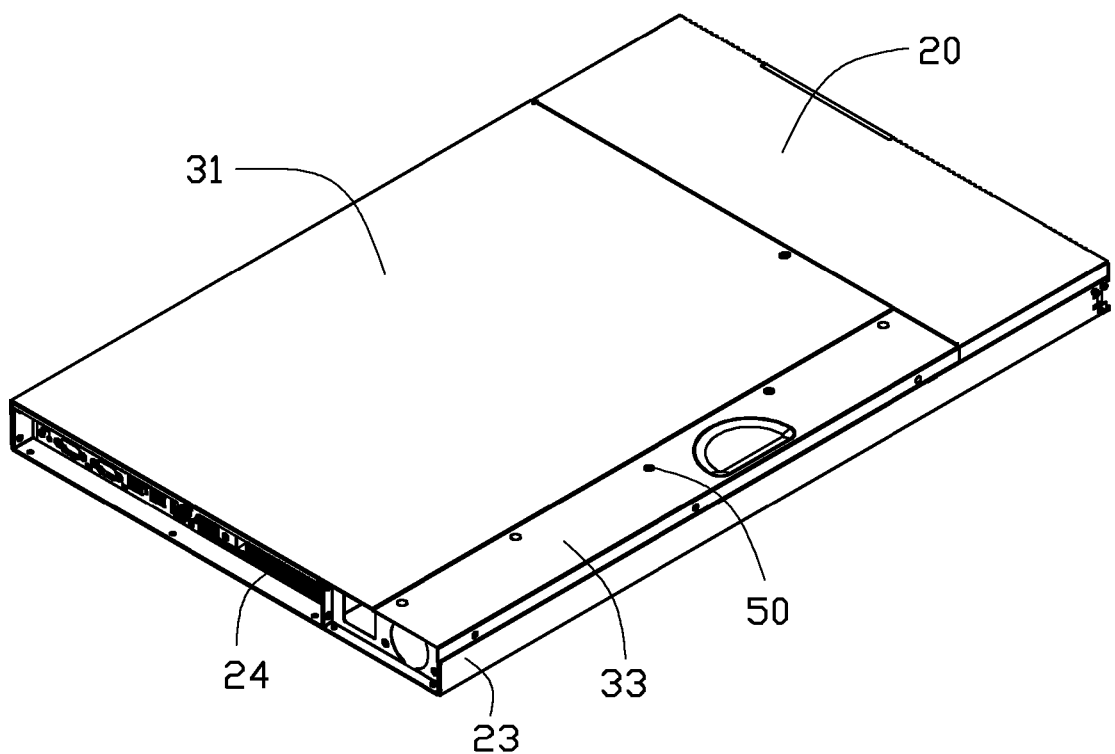
FIG. 4 is an assembled, isometric view of FIG. 1.

Referring to FIGS. 2 to 4, in assembly, a plurality of connection members 40 is extended through the through holes 331 of the second plate 33 and the corresponding slide slots 3182 of the first plate 31. Thereby, the second plate 33 is slidably connected to the first plate 31, and the side plate 30 is assembled. The second plate 33 is moved away from the first plate 31, and the side plate 30 partially covers the base 20. The side plate 30 is moved toward the second end wall 25 until the side plate 30 entirely covers the base 20. The first and second plates 31 and 33 are moved toward each other, to allow the flanges 315 and 334 of the first and second plates 31 and 33 to engage with the corresponding sidewalls 23 of the base 20. The connection piece 318 of the first plate 31 is covered by the second plate 33, and the connection members 40 engage with ends of the corresponding slide slots 3182 adjacent to the edge 317 of the first plate 31. The second fixing hole 333 of the second plate 33 aligns with the first fixing hole 3184 of the first plate 31. A fastener 50, such as a screw, is extended through the second fixing hole 333 and engages in the first fixing hole 3184, to fix the second plate 33 to the first plate 31. A plurality of screws (not shown) is extended through the securing portions of the first and second plates 31 and 33, and engages in the corresponding fixing portions 231, 241, and 251 of the base 20, to fix the side plate 30 to the base 20. Thereby, the chassis 10 is assembled.

To open the chassis 10, the screws mounted to the side plate 30 and the base 20 are detached. Thereby, the side plate 30 is disengaged from the base 20. The fastener 50 is detached, to disengage the second plate 33 from the first plate 31. The first and second plates 31 and 33 are slid away from each other, to allow the flanges 315 and 334 of the first and second plates 31 and 33 to separate from the corresponding sidewalls 23 of the base 20. The side plate 30 can be easily detached from the base 20 through sliding away from the second end wall 25, because there is no friction between the flanges 315, 334 and the corresponding sidewalls 23.

In other embodiments, the fixing portions of the base 20 and the securing portions of the side plate 30 may be latches or hooks.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A chassis of an electronic device, comprising:
   a base comprising a rectangular bottom wall, two opposite sidewalls and two opposite end walls perpendicularly extending up from the bottom wall; and
   a side plate covering and connected to the base in parallel with the bottom wall, the side plate comprising a first plate and a second plate slidably connected to the first plate, wherein when the side plate is to be disengaged from the base, one of the first and second plates slides in a first direction away from the other one of the first and second plates, and then the first and second plates slide along the base in a second direction perpendicular to the first direction with the first and second plates continuously supported on the sidewalls, the first direction is perpendicular to the sidewalls of the base, and the second direction is perpendicular to the end walls of the base.

2. The chassis of claim 1, wherein a fixing portion is formed on an upper section of each of the sidewalls and end walls, three securing portions are respectively formed on three edges of the first plate away from the second plate, to engage with the corresponding fixing portions of the end walls and one of the sidewalls of the base, a securing portion is formed on an edge of the second plate away from the first plate, to engage with the corresponding fixing portion of the other one of the sidewalls of the base.

3. The chassis of claim 1, wherein a slide slot parallel to the first direction is defined in a portion of the first plate adjacent to the second plate, a through hole is defined in a portion of the second plate adjacent to the first plate, a connection member is extended through the through hole and the slide slot, to slidably connect the second plate to the first plate.

4. The chassis of claim 3, wherein a first fixing hole is defined in the portion of the first plate adjacent to the second plate, a second fixing hole is defined the second plate, when the side plate engages with the base, the second fixing hole aligns with the first fixing hole, a fastener is extended through the second fixing hole and engages in the first fixing hole, to fix the second plate to the first plate.

5. The chassis of claim 4, wherein a thin connection piece is formed on the portion of the first plate adjacent to the second plate, the slide slot and the first fixing hole are defined in the connection piece, when the side plate engages with the base, the second plate covers the connection piece.

6. A chassis of an electronic device, comprising: a base; and a side plate covering and connected to the base, the side plate comprising a first plate and a second plate, wherein an elongated slide slot is defined in a portion of the first plate adjacent to the second plate, a through hole is defined in a portion of the second plate adjacent to the first plate, a connection member is extended through the through hole and the slide slot, to slidably connect the second plate to the first plate, when the side plate is to be disengaged from the base, one of the first and second plates slides in a first direction away from the other one of the first and second plates; wherein the base comprises a bottom wall parallel with the side plate, and two opposite sidewalls perpendicularly extending up from the bottom wall to support the side plate, the first direction is perpendicular to the sidewalls, when one of the first and second plates is slid away from the other one of the first and second plates, the first and second plates slide in a longitudinal direction of the sidewalls parallel with the bottom wall, with the first and second plates continuously supported on the sidewalls.

7. The chassis of claim 6, wherein the base further comprises two opposite end walls perpendicularly connected between the sidewalls, a fixing portion is formed on an upper section of each of the sidewalls and end walls, three securing portions are respectively formed on three edges of the first plate away from the second plate, to engage with the corresponding fixing portions of the end walls and one of the sidewalls of the base, a securing portion is formed on an edge of the second plate away from the first plate, to engage with the corresponding fixing portion of the other one of the sidewalls of the base.

8. The chassis of claim 6, wherein a first fixing hole is defined in the portion of the first plate adjacent to the second plate, a second fixing hole is defined the second plate, when the side plate engages with the base, the second fixing hole aligns with the first fixing hole, a fastener is extended through the second fixing hole and engages in the first fixing hole, to fix the second plate to the first plate.

9. The chassis of claim 8, wherein a thin connection piece is formed on the portion of the first plate adjacent to the second plate, the slide slot and the first fixing hole are defined in the connection piece, when the side plate engages with the base, the second plate covers the connection piece.

10. A chassis of an electronic device, comprising:
a base comprising a rectangular bottom wall, and two opposite sidewalls perpendicularly extending up from the bottom wall; and
a side plate covering and connected to the base, the side plate comprising a first plate and a second plate partly overlapped and slidably connected with each other; the first plate comprising a flange depending from an edge thereof, the second plate comprising a flange depending from an edge thereof; the first and second plates supported by top edges of the sidewalls, and the flanges abutting against exteriors of the sidewalls respectively, therefore the side plate engagingly covers the base; wherein when the side plate is disengaged from the base, one of the first and second plates is slid away from the other one in a direction parallel to the bottom wall and perpendicular to the sidewalls, such that the flange of the one of the first and second plates is moved out of contact with the corresponding sidewall, to reduce friction between the first and second plates and the top edges of the sidewalls for easier sliding of the first and second plates so that the first and second plates can together slide along in a direction parallel to and on the top edges of the sidewalls.

11. The chassis of claim 10, wherein an elongated slide slot is defined in the first plate, a connection member extends from the second plate to slidably received in the slide slot, thereby slidably connecting the first and second plates together.

12. The chassis of claim 11, wherein the first plate comprises a connection piece offsettingly extending from an edge thereof opposite to the edge from which the flange of the first plate extends, the slide slot is defined in the connection piece; an edge of the second plate opposite to the flange of the second plate abuts against a junction of the offset connection piece while the flange of the second plate abuts against the exterior of the corresponding sidewall.

* * * * *